United States Patent
Ihara et al.

(10) Patent No.: US 10,199,423 B2
(45) Date of Patent: Feb. 5, 2019

(54) CMOS IMAGE SENSORS INCLUDING A VERTICAL SOURCE FOLLOWER GATE

(71) Applicant: Samsung Electronics Co., Ltd., Suwon-si, Gyeonggi-do (KR)

(72) Inventors: Hisanori Ihara, Seongnam-si (KR); Jungchak Ahn, Yongin-si (KR)

(73) Assignee: Samsung Electronics Co., Ltd. (KR)

(*) Notice: Subject to any disclaimer, the term of this patent is extended or adjusted under 35 U.S.C. 154(b) by 30 days.

(21) Appl. No.: 15/403,755

(22) Filed: Jan. 11, 2017

(65) Prior Publication Data
US 2017/0200759 A1   Jul. 13, 2017

(30) Foreign Application Priority Data

Jan. 12, 2016 (KR) .................. 10-2016-0003637

(51) Int. Cl.
| | |
|---|---|
| *H01L 27/146* | (2006.01) |
| *H04N 5/3745* | (2011.01) |
| *H04N 5/376* | (2011.01) |
| *H04N 5/378* | (2011.01) |

(52) U.S. Cl.
CPC .... *H01L 27/14643* (2013.01); *H01L 27/1461* (2013.01); *H01L 27/1463* (2013.01); *H01L 27/14614* (2013.01); *H04N 5/378* (2013.01); *H04N 5/3765* (2013.01); *H04N 5/37455* (2013.01)

(58) Field of Classification Search
CPC ............. H01L 27/1464; H01L 29/4236; H01L 27/14614; H01L 27/146; H01L 27/14612; H01L 27/14621; H01L 27/14627; H01L 27/1463; H01L 27/14638; H01L 27/14641; H01L 27/14645; H01L 29/1037
See application file for complete search history.

(56) References Cited

U.S. PATENT DOCUMENTS

| | | | |
|---|---|---|---|
| 5,970,333 A | 10/1999 | Gris et al. | |
| 6,121,148 A | 9/2000 | Bashir | |

(Continued)

FOREIGN PATENT DOCUMENTS

| | | |
|---|---|---|
| CN | 104882460 A | 9/2015 |
| JP | 2970637 B2 | 11/1999 |

(Continued)

OTHER PUBLICATIONS

AN101 "An Introduction to FETs", Shockley, Mar. 10, 1997, pp. 1-5.

(Continued)

*Primary Examiner* — Mohsen Ahmadi
*Assistant Examiner* — Gustavo Ramallo
(74) *Attorney, Agent, or Firm* — Myers Bigel, P.A.

(57) ABSTRACT

A complementary metal oxide semiconductor (CMOS) image sensor is provided that includes a substrate including a first surface, a second surface facing the first surface, and a first recess region that is recessed from the first surface toward the second surface. The CMOS image sensor further includes a transfer gate on the substrate, and a source follower gate on the first recess region. The source follower gate is within the first recess region and partially covers a portion of the first surface of the substrate.

16 Claims, 16 Drawing Sheets

(56) References Cited

U.S. PATENT DOCUMENTS

| | | | |
|---|---|---|---|
| 6,291,280 B1* | 9/2001 | Rhodes | H01L 21/823406 257/E21.617 |
| 7,750,964 B2 | 7/2010 | Hirota et al. | |
| 8,363,142 B2 | 1/2013 | Tashiro | |
| 8,471,310 B2 | 6/2013 | Hynecek | |
| 8,637,910 B2 | 1/2014 | Koo et al. | |
| 8,691,660 B2 | 4/2014 | Schuler et al. | |
| 8,716,769 B2 | 5/2014 | Ihara et al. | |
| 8,823,070 B2 | 9/2014 | Hisanori | |
| 8,937,272 B2 | 1/2015 | Hynecek | |
| 9,025,063 B2 | 5/2015 | Ahn et al. | |
| 9,305,947 B2 | 4/2016 | Ihara | |
| 9,337,224 B2 | 5/2016 | Ihara | |
| 2007/0158709 A1* | 7/2007 | Mouli | H01L 27/14601 257/291 |
| 2008/0001192 A1* | 1/2008 | Inoue | H01L 27/14603 257/291 |
| 2009/0303366 A1* | 12/2009 | Gambino | H01L 27/14623 348/308 |
| 2013/0082312 A1 | 4/2013 | Hung et al. | |
| 2013/0256509 A1 | 10/2013 | Yang et al. | |
| 2014/0327059 A1 | 11/2014 | Ammo | |
| 2014/0347538 A1* | 11/2014 | Toda | H01L 27/14603 348/308 |
| 2016/0056198 A1* | 2/2016 | Lee | H01L 27/14612 257/225 |

FOREIGN PATENT DOCUMENTS

| | | |
|---|---|---|
| JP | 2015162679 A | 9/2015 |
| KR | 100670606 B1 | 1/2007 |
| KR | 20130134791 A | 12/2013 |
| KR | 2015010681 A | 9/2015 |
| TW | 201543659 A | 11/2015 |

OTHER PUBLICATIONS

"Samsung Launches ISOCELL: Innovative Image Sensor Technology for Premium Mobile Devices", Sep. 24, 2013, pp. 1-11.

"Samsung Launches ISOCELL: Innovative Image Sensor Technology for Premium Mobile Devices", Sep. 23, 2013, pp. 1-2.

"Samsung Explains the Galaxy S5's ISOCELL Sensor", Mar. 13 2014, pp. 1-9.

* cited by examiner

CMOS IMAGE SENSORS INCLUDING A VERTICAL SOURCE FOLLOWER GATE

CROSS-REFERENCE TO RELATED APPLICATIONS

This U.S. non-provisional patent application claims priority under 35 U.S.C. § 119 to Korean Patent Application 10-2016-0003637 filed on Jan. 12, 2016, the entire contents of which are hereby incorporated by reference.

BACKGROUND

The present inventive concepts relate to image sensors and, more particularly, to complementary metal oxide semiconductor (CMOS) image sensors including source follower gates disposed in recess regions of a substrate.

An image sensor transforms optical images into electrical signals. Recent advances in the computer and communication industries have led to strong demand for high performance image sensors in various consumer electronic devices such as digital cameras, camcorders, PCSs (Personal Communication Systems), game devices, security cameras, medical micro cameras, etc.

Image sensors may be classified into various types, including a charge coupled device (CCD) type and a complementary metal oxide semiconductor (CMOS) type. CMOS image sensors may have less complicated operating methods and may be minimized by integrating signal processing circuits into a single chip. CMOS image sensors may require relatively small power consumption, which can be useful in devices with limited battery capacity. Additionally, the fabrication cost can be reduced by using CMOS fabrication technologies.

SUMMARY

Embodiments of the present inventive concepts provide complementary metal oxide semiconductor image sensors including a vertical structural source follower gate.

According to example embodiments of the present inventive concepts, a complementary metal oxide semiconductor (CMOS) image sensor may include: a substrate including a first surface, a second surface facing the first surface, and a first recess region that is recessed from the first surface toward the second surface; a transfer gate on the substrate; and a source follower gate on the first recess region. The source follower gate may be within the first recess region and may partially cover the first surface of the substrate.

According to example embodiments of the present inventive concepts, a complementary metal oxide semiconductor (CMOS) image sensor may include: a first device isolation layer in the substrate and defining a first pixel region and a second pixel region; a second device isolation layer defining first and second active sections in each of the first and second pixel regions; a source follower gate on the second active section of the first pixel region; a first transfer gate on the first active section of the first pixel region; and a second transfer gate on the first active section of the second pixel region. The source follower gate may comprise: a first lower portion in a first recess region on the second active section of the first pixel region; and a first upper portion that is connected to the first lower portion and is on a top surface of the substrate.

According to example embodiments of the present inventive concepts, a complementary metal oxide semiconductor (CMOS) image sensor may include: a substrate including a first surface and a second surface that is opposite the first surface; and a source follower gate on the substrate. The first surface may include a first portion and a second portion. The first portion of the first surface may be a first distance from the second surface. The second portion of the first surface may be a second distance that is smaller than the first distance from the second surface. The source follower gate may have a first portion of the source follower gate on the first portion of the first surface and a second portion of the source follower gate on the second portion of the first surface.

BRIEF DESCRIPTION OF THE DRAWINGS

The inventive concepts will become more apparent in view of the attached drawings and accompanying detailed description in which the same reference numerals or the same reference designators denote the same or similar elements throughout the specification.

FIGS. 8A to 8C shows other examples of a source follower gate according to example embodiments of the present inventive concepts, wherein FIGS. 8A and 8B are cross-sectional views taken along line D-D' of FIG. 3 and FIG. 8C is a cross-sectional view taken along line C-C' of FIG. 3;

DETAILED DESCRIPTION OF EMBODIMENTS

Figure 1:
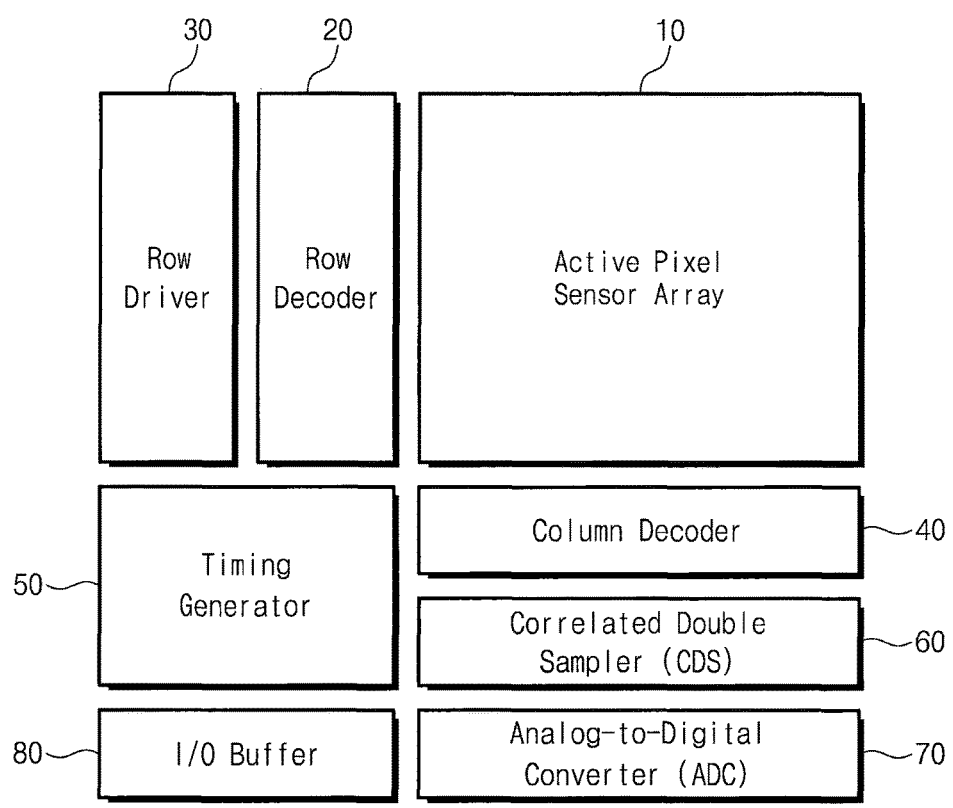
FIG. 1 is a block diagram illustrating a complementary metal oxide semiconductor image sensor according to example embodiments of the present inventive concepts.

FIG. 1 is a block diagram illustrating a complementary metal oxide semiconductor image sensor according to example embodiments of the present inventive concepts.

Referring to FIG. 1, a complementary metal oxide semiconductor (CMOS) image sensor may include an active pixel sensor array 10, a row decoder 20, a row driver 30, a column decoder 40, a timing generator 50, a correlated double sampler (CDS) 60, an analog-to-digital converter (ADC) 70, and an I/O buffer 80.

The active pixel sensor array 10 may include a plurality of two-dimensionally arranged unit pixels, each of which is configured to convert optical signals into electrical signals. The active pixel sensor array 10 may be driven by a plurality of driving signals such as a pixel selection signal, a reset signal, and/or a charge transfer signal from the row driver 30. The converted electrical signals may be provided to the correlated double sampler 60.

The row driver 30 may provide driving signals for driving unit pixels to the active pixel sensor array 10 in accordance with a decoded result obtained from the row decoder 20. In some embodiments, the unit pixels may be arranged in a matrix shape, and the driving signals may be supplied to respective rows.

The timing generator 50 may provide timing and control signals to the row decoder 20 and the column decoder 40.

The correlated double sampler (CDS) 60 may receive the electrical signals generated in the active pixel sensor array 10, and hold and sample the received electrical signals. The correlated double sampler 60 may perform a double sampling operation to sample a specific noise level and a signal level of the electrical signal, and then output a difference level corresponding to a difference between the noise and signal levels.

The analog-to-digital converter (ADC) 70 may convert analog signals corresponding to the difference level output from the correlated double sampler 60 into digital signals, and then output the converted digital signals.

The I/O buffer 80 may latch the digital signals and then sequentially output the latched digital signals to an image signal processing unit (not shown) in response to the decoded result obtained from the column decoder 40.

Figure 2:
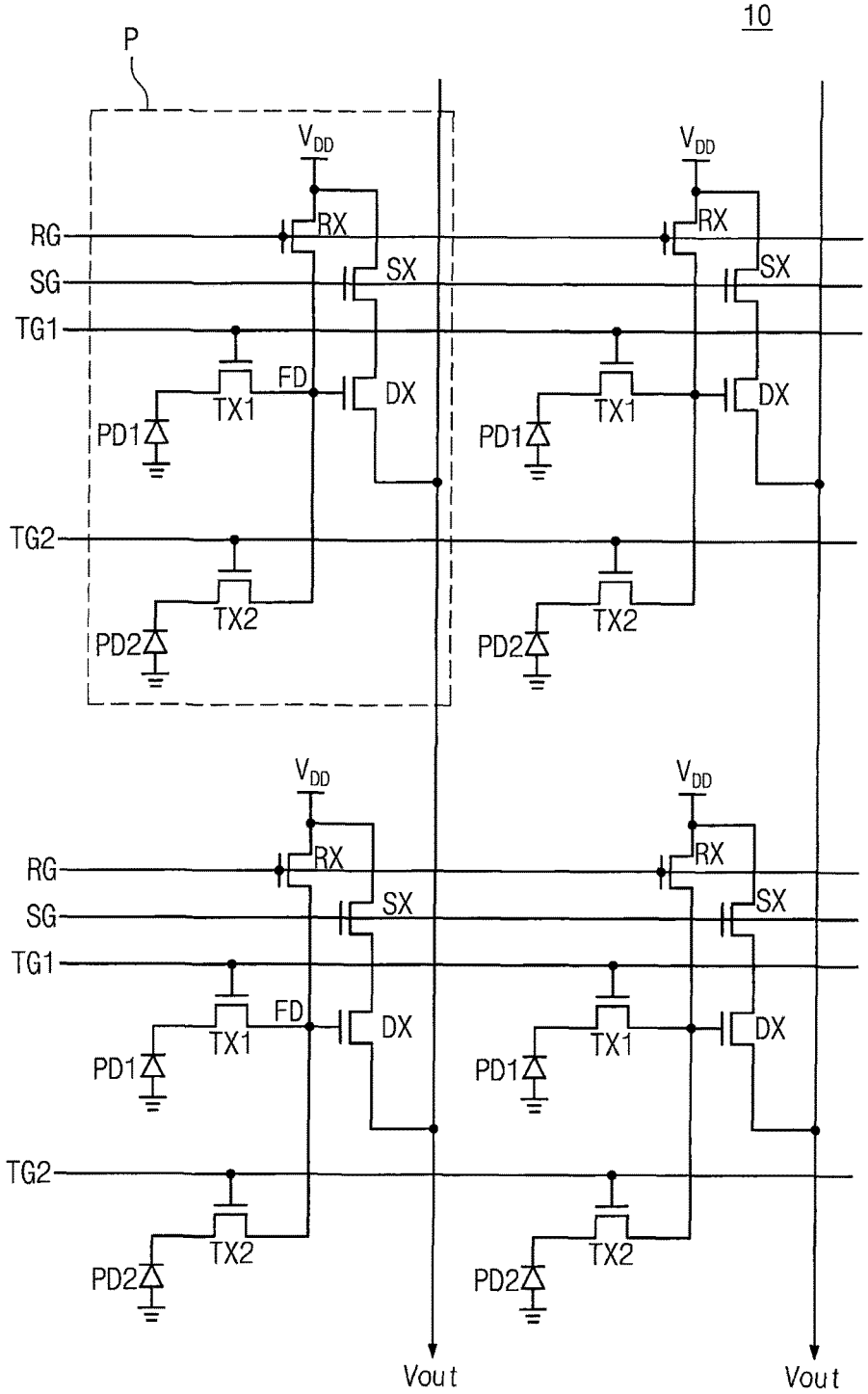
FIG. 2 is a circuit diagram illustrating an active pixel sensor array of a complementary metal oxide semiconductor image sensor according to example embodiments of the present inventive concepts.

FIG. 2 is a circuit diagram illustrating an active pixel sensor array 10 of a complementary metal oxide semiconductor image sensor according to example embodiments of the present inventive concepts.

Referring to FIG. 2, the active pixel sensor array 10 may include a plurality of unit pixels P, which may be arranged in a matrix form. Each of the unit pixels P may include a first transfer transistor TX1, a second transfer transistor TX2, and logic transistors. The logic transistors may include a reset transistor RX, a selection transistor SX, and a drive transistor or source follower transistor DX.

The first transfer transistor TX1 may include a first transfer gate TG1 and a terminal coupled to a first photoelectric conversion device PD1, and the second transistor TX2 may include a second transfer gate TG2 and a terminal coupled to a second photoelectric conversion device PD2. The first and second transfer transistors TX1 and TX2 may both be coupled to a charge detection node FD, i.e., a floating diffusion region. The number of the transfer transistors is not limited to two, but the number thereof may be variously changed.

The first and second photoelectric conversion devices PD1 and PD2 may generate and accumulate photo-charges in proportion to an amount of incident light. The first and second photoelectric conversion devices PD1 and PD2 may be one of a photo diode, a photo transistor, a photo gate, a pinned photo diode (PPD), or any combination thereof.

The first and second transfer gates TG1 and TG2 may transfer the charges accumulated in the first and second photoelectric conversion devices PD1 and PD2 to the charge detection node FD, i.e., the floating diffusion region. The first and second transfer gates TG1 and TG2 may receive complementary signals. In other words, the charges may be transferred to the charge detection node FD from one of the first and second photoelectric conversion devices PD1 and PD2.

The charge detection node FD may receive and store the charges generated in the first and second photoelectric conversion devices PD1 and PD2. The drive transistor DX may be coupled to the charge detection node FD and may be controlled by an amount of photo-charges accumulated in the charge detection node FD.

The reset transistor RX may periodically reset the charges accumulated in the charge detection node FD. Specifically, the reset transistor RX may include a drain electrode connected to the charge detection node FD and a source electrode connected to a power supply voltage VDD. The reset transistor RX may be activated by a reset signal RG coupled to the gate of the reset transistor RX. When the reset transistor RX is turned on, the power supply voltage VDD connected to the source electrode of the reset transistor RX may be transmitted to the charge detection node FD. Accordingly, the charges accumulated in the charge detection node FD may be exhausted and thus the charge detection node FD may be reset when the reset transistor RX is turned on.

In conjunction with a static current source (not shown) located outside the unit pixel P, the drive transistor DX may serve as a source follower buffer amplifier. The drive transistor DX may have a source potential which varies in proportion to the amount of charges accumulated in the charge detection node FD. The drive transistor DX may amplify a variation in electrical potential of the charge detection node FD, and output the amplified electrical potential to an output line Vout.

The selection transistor SX may select each row of the unit pixels P in a read operation. The selection transistor SX may be activated by a selection signal SG coupled to the gate of the selection transistor SX. When the selection transistor SX is turned on, the power supply voltage VDD connected to a drain electrode of the selection transistor SX may be transmitted to a drain electrode of the drive transistor DX.

Figure 3:
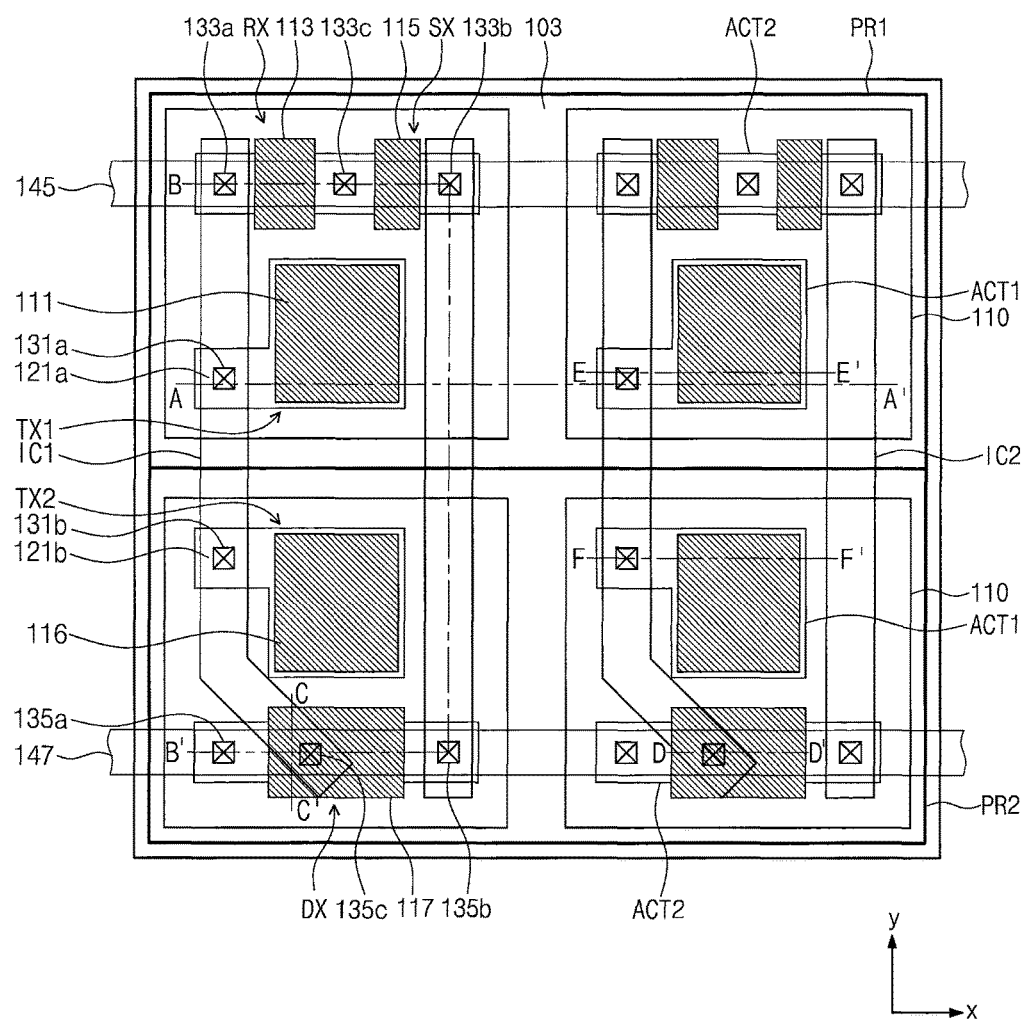
FIG. 3 is a plan view illustrating a complementary metal oxide semiconductor image sensor according to example embodiments of the present inventive concepts.
Figure 4:
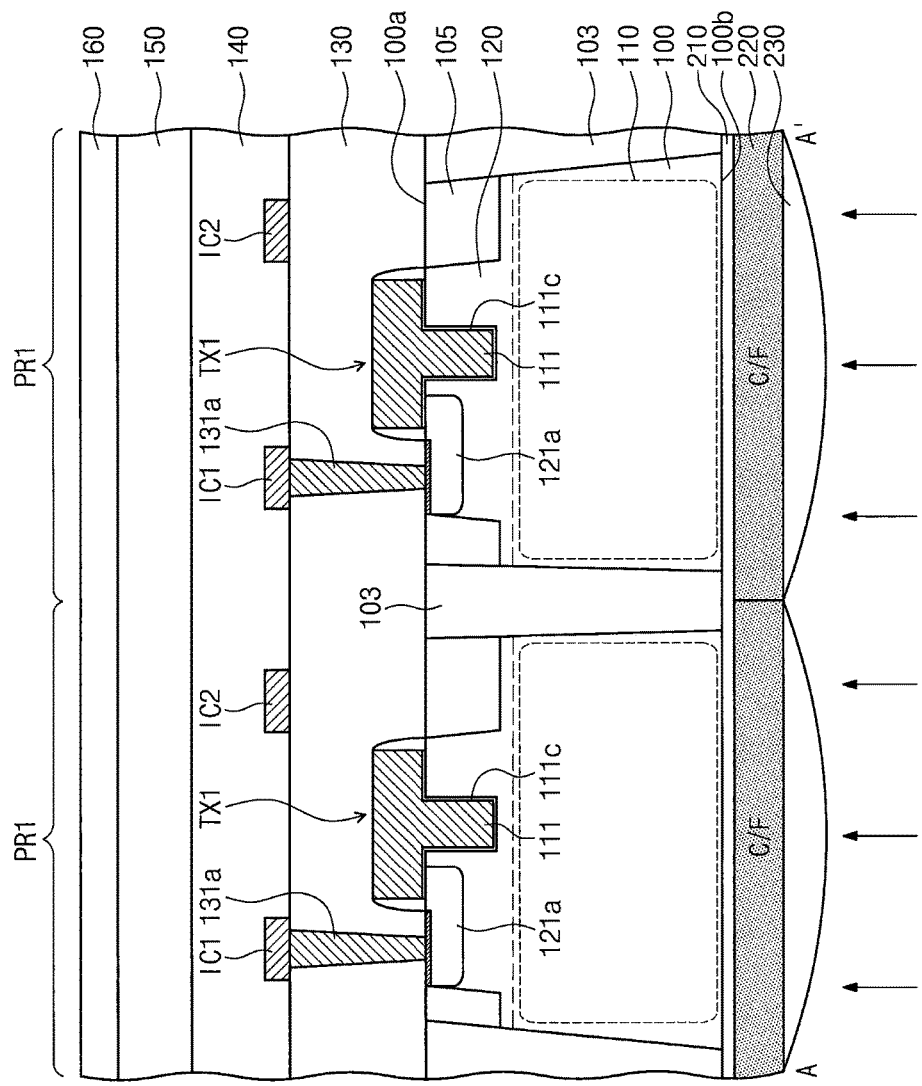
FIG. 4 is a cross-sectional view taken along line A-A' of FIG. 3.
Figure 5:
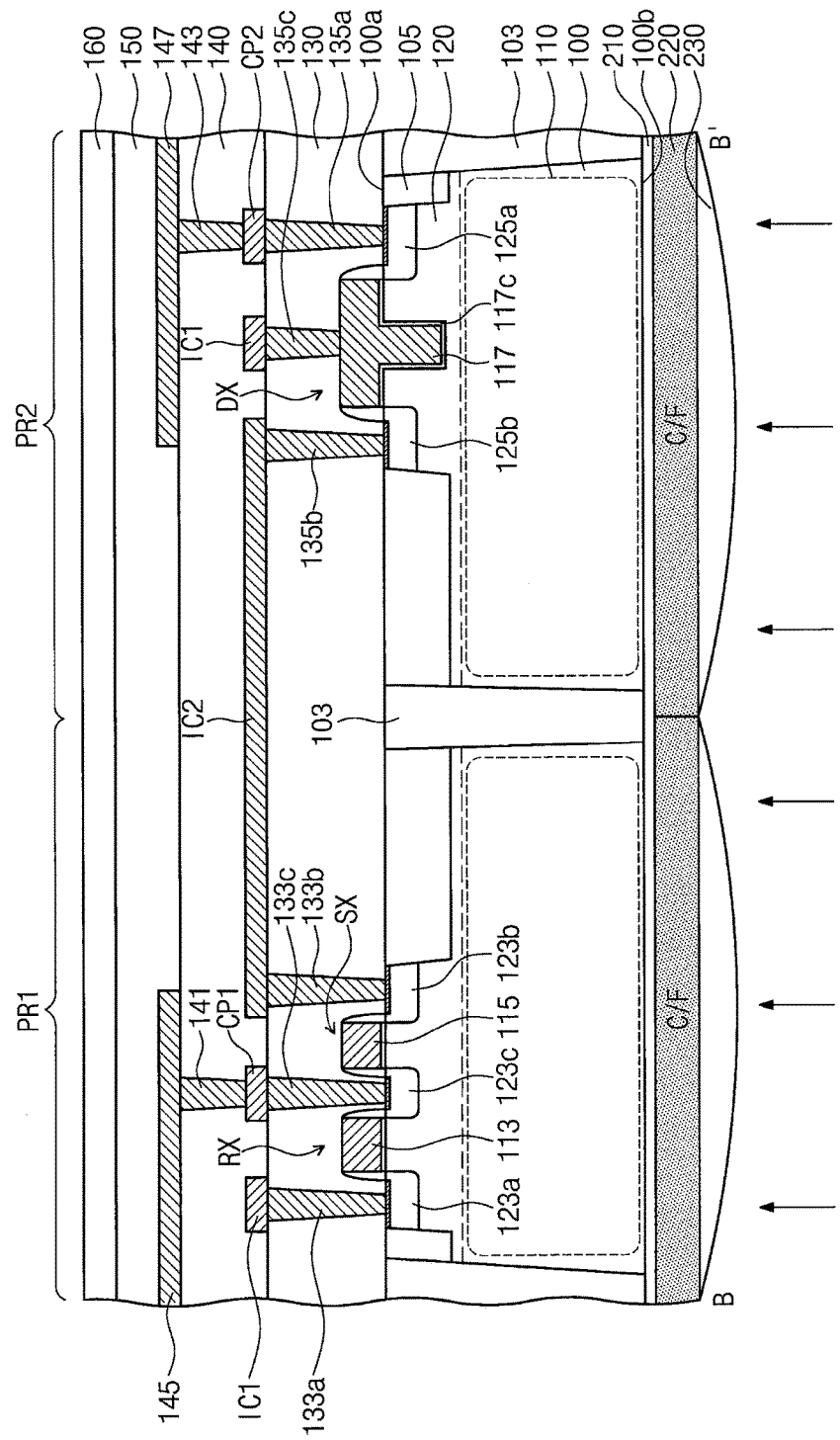
FIG. 5 is a cross-sectional view taken along line B-B' of FIG. 3.

FIG. 3 is a plan view illustrating a complementary metal oxide semiconductor image sensor according to example embodiments of the present inventive concepts. FIG. 4 is a cross-sectional view taken along line A-A' of FIG. 3. FIG. 5 is a cross-sectional view taken along line B-B' of FIG. 3.

Referring to FIGS. 3 to 5, a substrate 100 may include a first pixel region PR1 and a second pixel region PR2, and each of the first and second pixel regions PR1 and PR2 may include a first active section ACT1 and a second active section ACT2. The first and second pixel regions PR1 and PR2 may be respectively provided in plural arranged along an x-axis direction, and the pluralities of the first and second pixel regions PR1 and PR2 may be alternately disposed along a y-axis direction.

As viewed in a plan view, the first and second pixel regions PR1 and PR2 may be arranged in the y-axis direction in such a way that the first active sections ACT1 of the first and second pixel regions PR1 and PR2 may be disposed adjacent each other. In other words, the first active sections ACT1 of the first and second pixel regions PR1 and PR2 may be disposed between the second active sections ACT2 of the first and second pixel regions PR1 and PR2.

The substrate 100 may include a first surface 100a and a second surface 100b facing each other. The substrate 100 may be a bulk silicon substrate, a silicon-on-insulator (SOI) substrate, or a semiconductor epitaxial layer.

A line structure may be disposed on the first surface 100a of the substrate 100, and the line structure may include the logic transistors and interconnection lines IC1 and IC2 connected thereto. A color filter layer 220 and a micro-lens 230 may be disposed on the second surface 100b of the substrate 100. A planarization layer 210 may be disposed between the color filter layer 220 and the second surface 100b of the substrate 100. The color filter layer 220 and the micro-lens 230 may be provided in plural to correspond to the first and second pixel regions PR1 and PR2. The color filter layer 220 may include a red filter, a green filter, and/or a blue filter, which may be disposed on respective unit pixels and two-dimensionally arranged. The color filter layer 220 may further include a white filter. The micro-lens 230 may have a convex shape and a specific curvature, and may condense an incident light to a corresponding one of the first and second pixel regions PR1 and PR2.

A photoelectric conversion layer 110 and a well impurity layer 120 may be disposed in the substrate 100 included in each of the first and second pixels regions PR1 and PR2. The photoelectric conversion layer 110 may generate photo-charges in proportion to the intensity of an incident light. In some embodiments of the present inventive concepts, the photoelectric conversion layer 110 may be formed by ion implanting impurities into the substrate 100 to form the photoelectric conversion layer 110 having a conductivity type opposite to that of the substrate 100. The photoelectric conversion layer 110 may have different impurity concentrations in its regions respectively adjacent to the first and second surfaces 100a and 100b in order to obtain a potential gradient between the first and second surfaces 100a and 100b of the substrate 100. For example, the photoelectric conversion layer 110 may have a plurality of impurity regions that are stacked on one another. The well impurity layer 120 may be disposed on the photoelectric conversion layer 110 to be adjacent the first surface 100a of the substrate 100. The well impurity layer 120 may be doped with impurities having a conductivity type opposite to that of the photoelectric conversion layer 110. For example, the photoelectric conversion layer 110 may be doped with n-type impurities, and the substrate 100 and the well impurity layer 120 may be doped with p-type impurities.

A first device isolation layer 103 may vertically extend from the first surface 100a toward the second surface 100b of the substrate 100. The first device isolation layer 103 may define the first and second pixel regions PR1 and PR2 and surround portions of the photoelectric conversion layer 110.

The first device isolation layer 103 may be formed of an insulative material having a refractive index less than that of the substrate 100. For example, the first device isolation layer 103 may include a silicon oxide layer, a silicon nitride layer, an undoped polysilicon layer, air, or a combination thereof. The first device isolation layer 103 may be formed by a DTI (deep trench isolation) process. In some embodiments of the present inventive concepts, the first device isolation layer 103 may be formed by patterning the first surface 100a and/or the second surface 100b of the substrate 100 to form a deep trench and then filling the deep trench with an insulative material. The first device isolation layer 103 may refract an incident light obliquely received to the photoelectric conversion layer 110. The first device isolation layer 103 may prevent the photo-charges from drifting into the first and second pixel regions PR1 and PR2, which may suppress cross talk resulting from the drift of the charges. It thus may be possible to enhance color reproduction characteristics of the complementary metal oxide semiconductor (CMOS) image sensor.

A second device isolation layer 105 may define the first and second active sections ACT1 and ACT2. The first and second active sections ACT1 and ACT2 may have different sizes and be spaced apart from each other in each of the first and second pixel regions PR1 and PR2. The second device isolation layer 105 may be formed in the well impurity layer 120. The first and second device isolation layers 103 and 105 may respectively have first and second lengths extending from the first surface 100a toward the second surface 100b of the substrate 100, and the second length of the second device isolation layer 105 may be less than the first length of the first device isolation layer 103. The second device isolation layer 105 may have a bottom surface disposed in the well impurity layer 120 and spaced apart from the photoelectric conversion layer 110. In an embodiment, the second device isolation layer 105 may be formed by patterning the first surface 100a of the substrate 100 to form a shallow trench and then filling the shallow trench with an insulative material. The second device isolation layer 105 may be an impurity region having a conductivity type substantially the same as that of the well impurity layer 120. In some embodiments, the second device isolation layer 105 may have an impurity concentration greater than that of the well impurity layer 120.

A first transfer gate 111 and a first floating diffusion region 121a may be disposed on the first active section ACT1 of the first pixel region PR1, and a second transfer gate 116 and a second floating diffusion region 121b may be disposed on the first active section ACT1 of the second pixel region PR2.

As viewed in a plan view, the first and second transfer gates 111 and 116 may be respectively positioned on central parts of the first and second pixel regions PR1 and PR2. A portion of each of the first and second transfer gates 111 and 116 may be disposed in the well impurity layer 120 and may extend toward the second surface 100b from the first surface 100a of the substrate 100. Another portion of each of the first and second transfer gates 111 and 116 may be disposed on the first surface 100a of the substrate 100. A first transfer gate dielectric layer 111c may be disposed between the substrate 100 and the first second transfer gate 111, and a second transfer gate dielectric layer 116c of FIG. 7 may be disposed between the substrate 100 and the second transfer gate 116. For example, the first and second transfer gate dielectric layers 111c and 116c may include at least one of silicon oxide (SiO2), silicon oxynitride (SiON), silicon nitride (SiN), germanium oxynitride (GeON), germanium silicon oxide (GeSiO), and/or a high-k material. In some embodiments of the present inventive concepts, the first and second transfer gates 111 and 116 may be respectively formed by forming a recess in the well impurity layer 120 and then sequentially forming a gate dielectric layer and a gate conductive layer in the recess.

The first diffusion floating region 121a may be disposed on a side of the first transfer gate 111 in the well impurity layer 120, and the second diffusion floating region 121b may be disposed on a side of the second transfer gate 116 in the well impurity layer 120. In some embodiments of the present inventive concepts, the first and second floating diffusion regions 121a and 121b may be formed by ion implanting impurities having a conductivity type opposite that of the well impurity layer 120. For example, the first and second floating diffusion regions 121a and 121b may be n-type impurity regions.

A reset gate 113 and a selection gate 115 may be disposed on the second active section ACT2 of the first pixel region PR1, and a source follower gate 117 may be disposed on the second active section ACT2 of the second pixel region PR2. Each of the reset gate 113 and the selection gate 115 may be disposed on the well impurity layer 120 with a gate dielectric layer interposed therebetween. The gate dielectric layer may include at least one of silicon oxide (SiO2), silicon oxynitride (SiON), silicon nitride (SiN), germanium oxynitride (GeON), germanium silicon oxide (GeSiO), and/or a high-k material. The source follower gate 117 may be disposed in the recess region formed in the well impurity layer 120. The source follower gate 117 may extend from the first surface 100a toward the second surface 100b of the substrate 100 and be disposed to partially cover the first surface 100a of the substrate 100. In other words, the first surface 100a may have an upper portion, and a lower portion between the upper portion and the second surface 100b of the substrate 100, so as to define the recess region. A source follower gate dielectric layer 117c may be interposed between the source follower gate 117 and the substrate 100. For example, the source follower gate dielectric layer 117c may include at least one of silicon oxide (SiO2), silicon oxynitride (SiON), silicon nitride (SiN), germanium oxynitride (GeON), germanium silicon oxide (GeSiO), and/or a high-k material.

A first impurity region 123a may be disposed on a side of the reset gate 113 in the well impurity layer 120, and a second impurity region 123b may be disposed a side of the selection gate 115 in the well impurity layer 120. A common impurity region 123c may be disposed in the well impurity layer 120 between the reset gate 113 and the selection gate 115. Also, a third impurity region 125a may be disposed on a side of the source follower gate 117 in the well impurity layer 120, and a fourth impurity region 125b may be disposed on an opposite side of the source follower gate 117 in the well impurity layer 120. In some embodiments of the present inventive concepts, the first to fourth impurity regions 123a, 123b, 125a and 125b and the common impurity region 123c may be formed by ion implanting impurities having a conductivity type opposite to that of the well impurity layer 120. For example, the first to fourth impurity regions 123a, 123b, 125a and 125b and the common impurity region 123c may be n-type impurity regions.

A first interlayer dielectric layer 130 may be formed on the first surface 100a of the substrate 100. The first interlayer dielectric layer 130 may cover the first and second transfer gates 111 and 116, the reset gate 113, the selection gate 115, and the source follower gate 117.

A plurality of contact plugs may be disposed in the first interlayer dielectric layer 130. The first impurity region 123a may be connected to a first contact plug 133a, and the second impurity region 123b may be connected to a second contact plug 133b. The common impurity region 123c may be connected to a common contact plug 133c. The third impurity region 125a may be connected to a third contact plug 135a, and the fourth impurity region 125b may be connected to a fourth contact plug 135b. The source follower gate 117 may be connected to a gate contact plug 135c. Also, the first and second floating diffusion regions 121a and 121b may be connected to first and second FD contact plugs 131a and 131b, respectively.

Each of the contact plugs 131a, 131b, 133a, 133b, 133c, 135a and 135b may include a barrier metal layer and a metal layer. The barrier metal layer may be formed of a metal nitride layer including at least one of titanium nitride, tantalum nitride, tungsten nitride, hafnium nitride, and zirconium nitride. The metal layer may include one of tungsten, copper, hafnium, zirconium, titanium, tantalum, aluminum, ruthenium, palladium, platinum, cobalt, nickel, conductive metal nitride, and any combination thereof. A silicide layer may be further formed between the contact plugs 131a and 131b and the first and second floating diffusion regions 121a and 121b, and between the contact plugs 133a, 133b, 133c, 135a and 135b and the impurity regions 123a, 123b, 123c, 125a and 125b.

A first interconnection line IC1 may be provided to electrically connect the first and second floating diffusion regions 121a and 121b, the first impurity region 123a, and the source follower gate 117 with one another. Accordingly, the first interconnection line IC1 may electrically connect a reset transistor RX, first and second transfer transistors TX1 and TX2, and a source follower transistor DX with one another. The first interconnection line IC1 may extend substantially in the y-axis direction. The first interconnection line IC1 may be disposed on the first interlayer dielectric layer 130 and electrically connected to the first and second floating diffusion regions 121a and 121b through the first and second FD contact plugs 131a and 131b, and further electrically connected to the first impurity region 123a through the first contact plug 133a. The first interconnection line IC1 may be electrically connected to the source follower gate 117 through the gate contact plug 135c.

A second interconnection line IC2 may be provided to electrically connect the second impurity region 123b and the fourth impurity region 125b to each other. The second interconnection line IC2 may extend substantially in the y-axis direction. The second interconnection line IC2 may be electrically connected to the second impurity region 123b through the second contact plug 133b and further electrically connected to the fourth impurity region 125b through the fourth contact plug 135b. In other words, the second interconnection line IC2 may electrically connect the selection transistor SX of the first pixel region PR1 and the source follower transistor DX of the second pixel region PR2 in series. A first conductive pattern CP1 may be further disposed on the first interlayer dielectric layer 130 and electrically connected to the common contact plug 133c, and a second conductive pattern CP2 may be further disposed on the first interlayer dielectric layer 130 to be electrically connected to the third contact plug 135a.

The first and second interconnection lines IC1 and IC2 and the conductive patterns CP1 and CP2 may be formed of an alloy including copper (Cu), aluminum (Al), tungsten (W), titanium (Ti), molybdenum (Mo), tantalum (Ta), titanium nitride (TiN), tantalum nitride (TaN), zirconium nitride (ZrN), tungsten nitride (TiN), or any combination thereof.

A second interlayer dielectric layer 140 may be provided on the first interlayer dielectric layer 130 and cover the first and second interconnection lines IC1 and IC2 and the first and second conductive patterns CP1 and CP2. A first upper plug 141 may be disposed in the second interlayer dielectric layer 140 and connected to the first conductive pattern CP1, and a second upper plug 143 may be disposed in the second interlayer dielectric layer 140 and connected to the second conductive pattern CP2.

First and second lines 145 and 147 may be disposed on the second interlayer dielectric layer 140 and extend along the x-axis direction. The first line 145 may be electrically connected to the common impurity region 123c through the common contact plug 133c, the first conductive pattern CP1, and the first upper plug 141. The second line 147 may be electrically connected to the third impurity region 125a through the third contact plug 135a, the second conductive pattern CP2, and the second upper plug 143. In other words, the first line 145 may be commonly connected to source electrodes of the reset transistor RX and the selection transistor SX, and the second line 147 may be connected to a drain electrode of the source follower transistor DX. The first line 145 may provide an input path for a power supply voltage VDD of FIG. 2, and the second line 147 may provide an output path for an optical signal generated in the first pixel region PR1 or the second pixel region PR2.

A third interlayer dielectric layer 150 and a passivation layer 160 may be disposed on the second interlayer dielectric layer 140 including the first and second lines 145 and 147 formed therein.

In general, as an area of the pixel region in the CMOS image sensor is decreased, a size of the source follower gate 117 may also become smaller. According to example embodiments of the present inventive concepts, the source follower gate 117 may be provided within a limited area but, due to having a vertical shape extending from the first surface 100a toward the second surface 100b of the substrate 100, the source follower gate 117 may have an increased area. Accordingly, during the operation of the CMOS image sensor, it may be advantageous to reduce noise generated when the charges are stored or released at the source follower gate dielectric layer 117c caused by current fluctuation in a channel of the source follower transistor DX.

Figure 6:
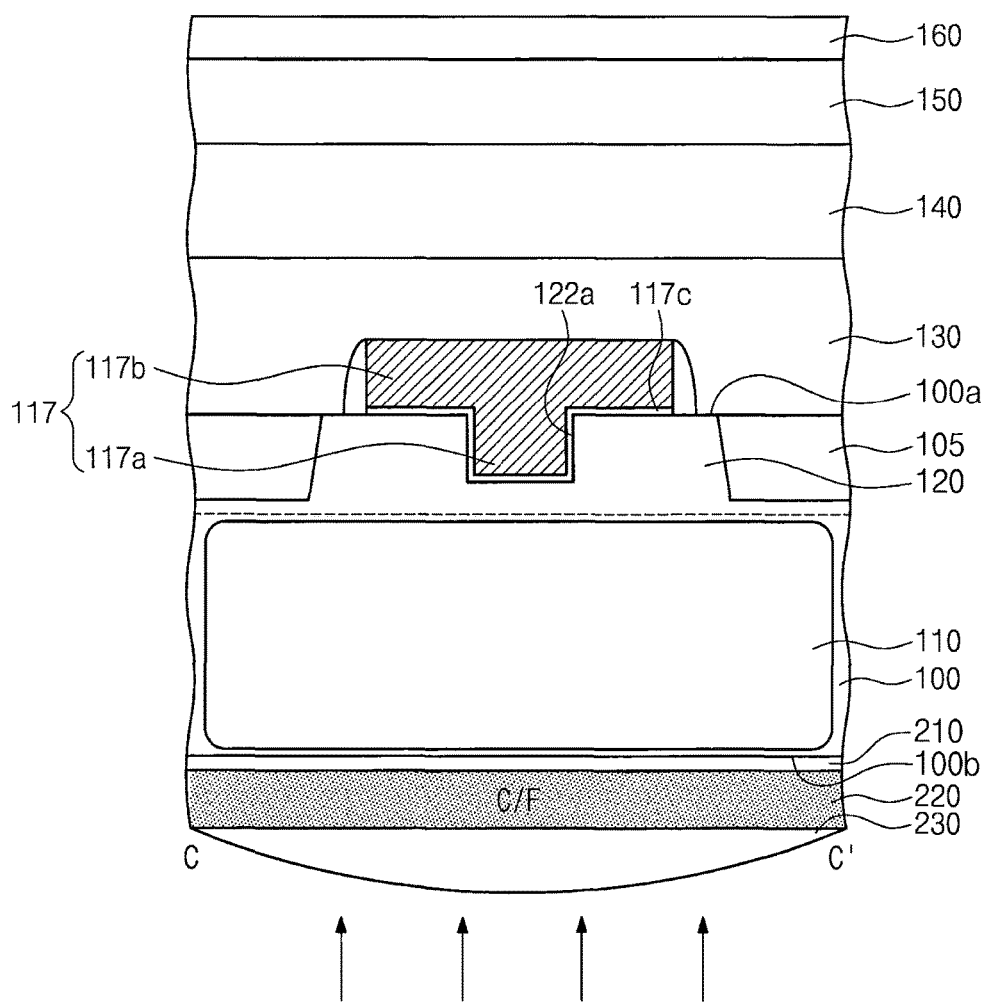
FIG. 6 is a cross-sectional view taken along line C-C' of FIG. 3.
Figure 7:
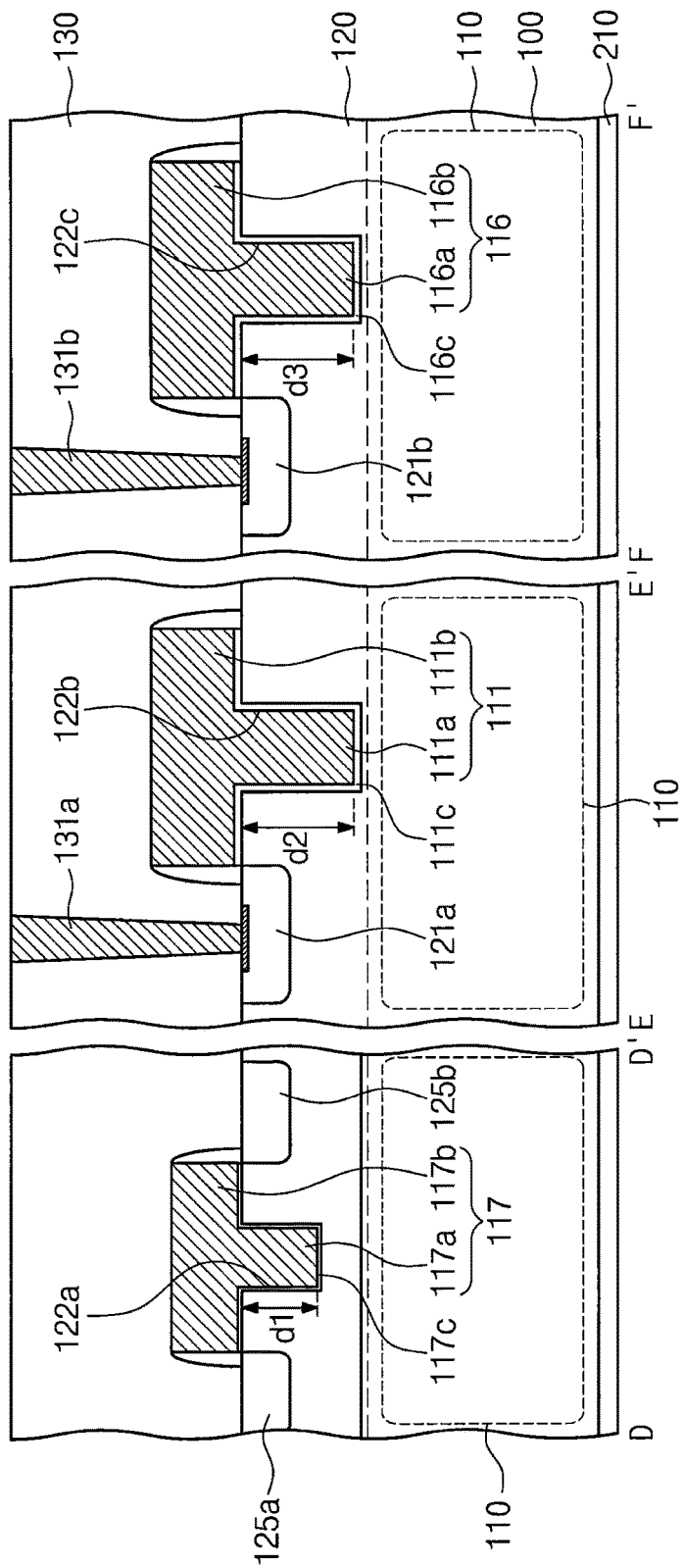
FIG. 7 is a cross-sectional view, taken along lines D-D', E-E' and F-F' of FIG. 3, illustrating transfer and source follower gates according to example embodiments of the present inventive concepts.

FIG. 6 is a cross-sectional view taken along line C-C' of FIG. 3. FIG. 7 is a cross-sectional view, taken along lines D-D', E-E' and F-F' of FIG. 3, illustrating transfer and source follower gates 117 according to example embodiments of the present inventive concepts. FIGS. 6 and 7 are enlarged cross-sectional views provided for convenience of description. Descriptions about the foregoing embodiments may be also applied to hereto, and thus repetitive descriptions will be omitted for conciseness.

Referring to FIGS. 3, 6 and 7, the well impurity layer 120 may include a plurality of recess regions 122a, 122b and 122c that are recessed from the first surface 100a toward the second surface 100b of the substrate 100. The recess regions 122a, 122b and 122c may include a first recess region 122a into which the source follower gate 117 is formed, a second recess region 122b into which the first transfer gate 111 in formed, and a third recess region 122c into which the second transfer gate 116 is formed.

The source follower gate 117 may include a first lower portion 117a disposed in the first recess region 122a and a first upper portion 117b disposed on the top surface 100a of the substrate 100. The source follower gate dielectric layer 117c may be interposed between the source follower gate 117 and the substrate 100. The first transfer gate 111 may include a second lower portion 111a disposed in the second recess region 122b and a second upper portion 111b disposed on the top surface 100a of the substrate 100. The second transfer gate 116 may include a third lower portion 116a disposed in the third recess region 122c and a third upper portion 116b disposed on the top surface 100a of the substrate 100. Each of the lower portions 111a and 116a of the first and second transfer gates 111 and 116 may partially penetrate the well impurity layer 120. The first transfer gate dielectric layer 111c may be interposed between the first transfer gate 111 and the substrate 100, and a second transfer gate dielectric layer 116c may be interposed between the second transfer gate 116 and the substrate 100.

The first lower portion 117a of the source follower gate 117 may extend to a first depth d1 from the first surface 100a toward the second surface 100b of the substrate 100. The second lower portion 111a of the first transfer gate 111 may extend to a second depth d2 from the first surface 100a toward the second surface 100b of the substrate 100. The third lower portion 116a of the second transfer gate 116 may extend to a third depth d3 from the first surface 100a toward the second surface 100b of the substrate 100. The first lower portion 117a may be shorter than the second and third lower portions 111a and 116a. In other words, the first depth d1 may be less than the second and third depths d2 and d3.

In some embodiments, the first to third lower portions 117a, 111a and 116a may be disposed spaced apart from the photoelectric conversion layer 110. In some embodiments, the first lower portion 117a may be disposed spaced apart from the photoelectric conversion layer 110, and the second and third lower portions 111a and 116a may be disposed in contact with the photoelectric conversion layer 110.

Figure 8A:
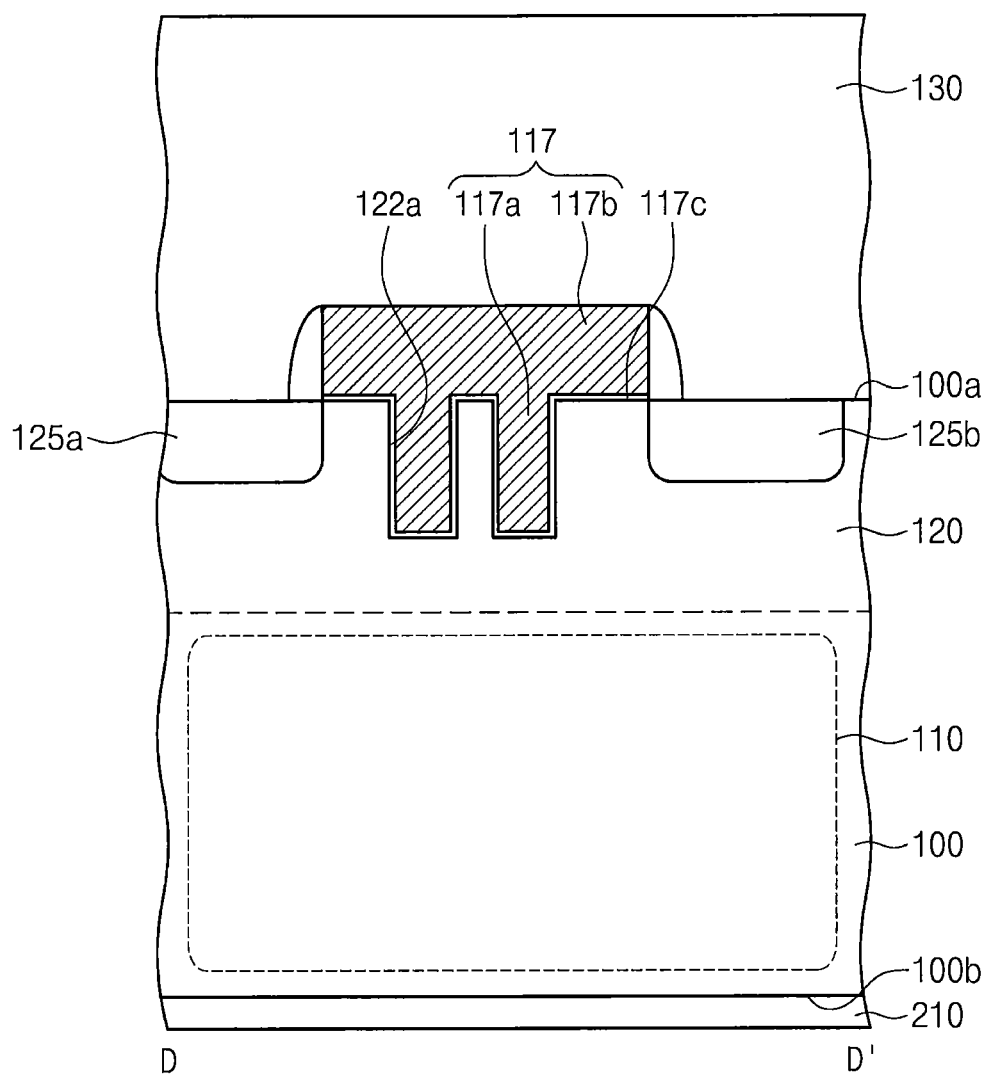
Figure 8B:
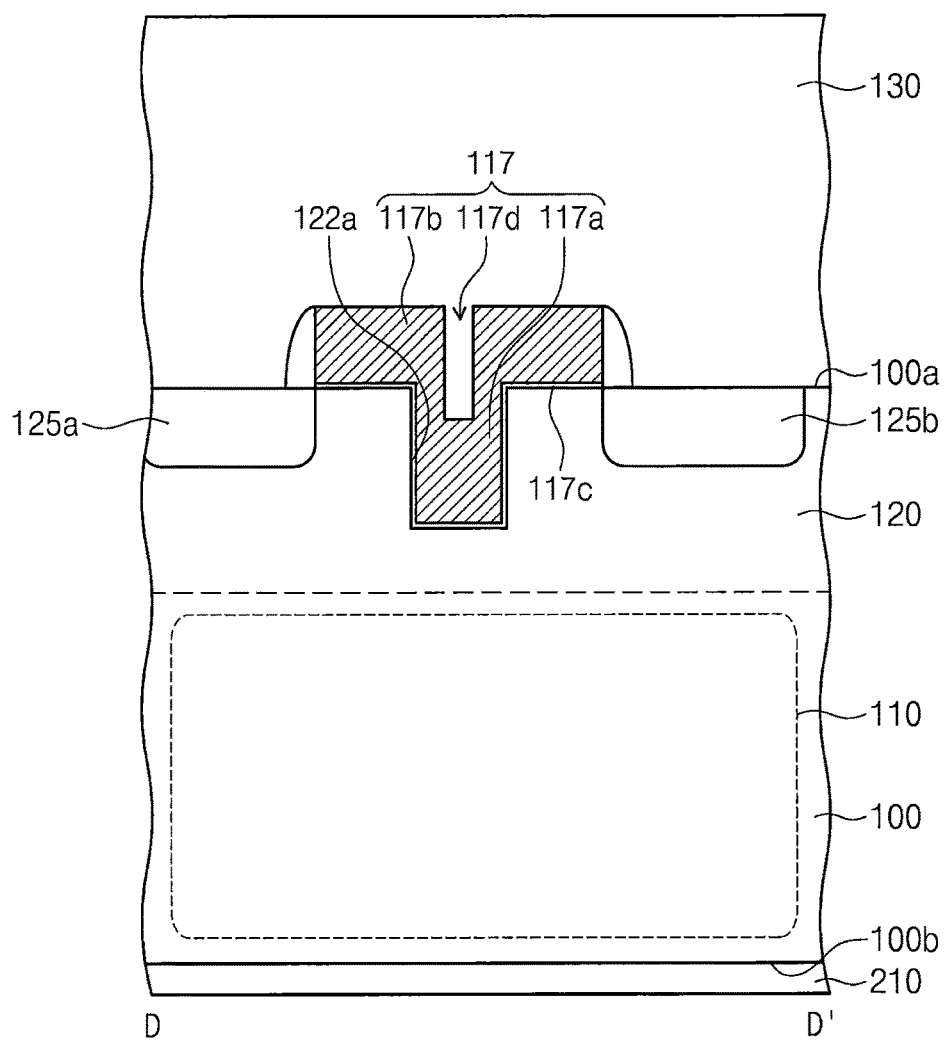
Figure 8C:
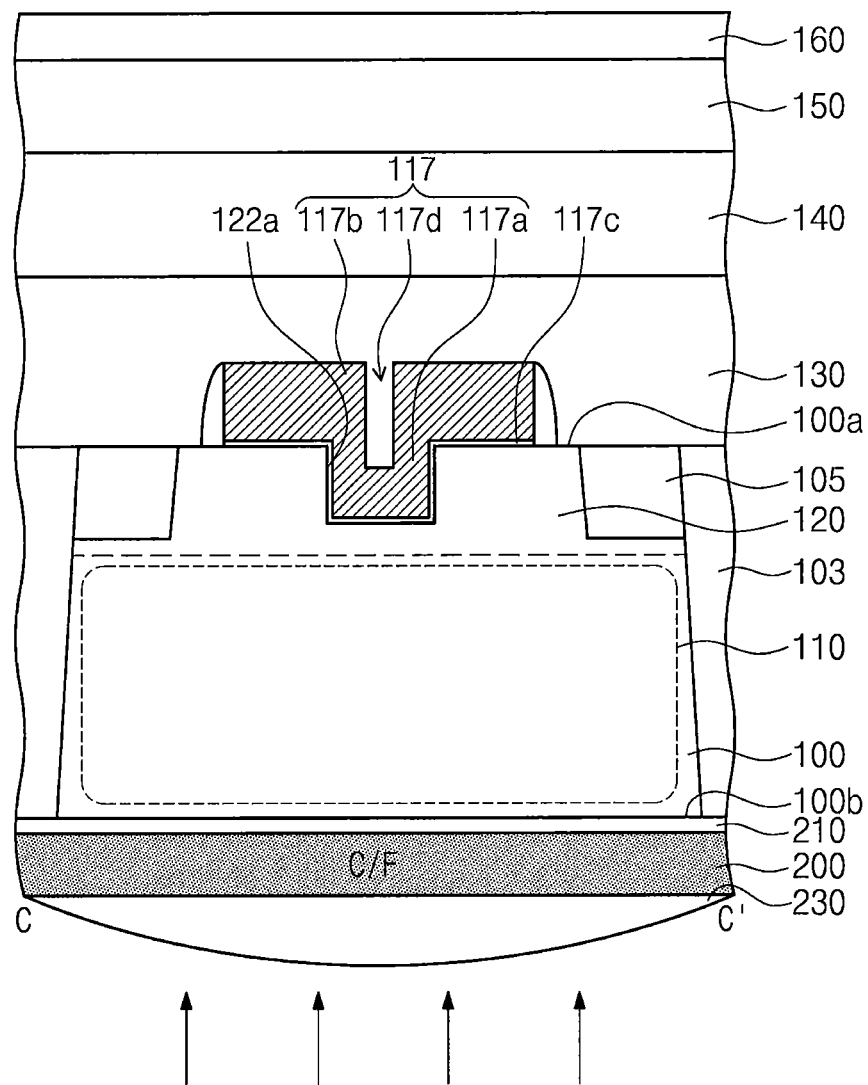

FIGS. 8A to 8C shows other examples of a source follower gate 117 according to example embodiments of the present inventive concepts, wherein FIGS. 8A and 8B are cross-sectional views taken along line D-D' of FIG. 3 and FIG. 8C is a cross-sectional view taken along line C-C' of FIG. 3. Descriptions about the foregoing embodiments may be also applied to hereto, and thus repetitive descriptions will be omitted for conciseness.

Referring to FIG. 8A, the source follower gate 117 may include a first upper portion 117b and a plurality of first lower portions 117a. The first upper portion 117b may be disposed on the first surface 100a of the substrate 100, and the first lower portions 117a may be respectively disposed in each of a plurality of first recess regions 122a provided in the well impurity layer 120. The first recess regions 122a may be recessed from the first surface 100a toward the second surface 100b of the substrate 100. The first lower portions 117a may be in contact with the first upper portion 117b, and may extend toward the second surface 100b from the first surface 100a of the substrate 100. The first lower portions 117a may be disposed spaced apart from the photoelectric conversion layer 110 provided in the substrate 100. The source follower gate 117 in FIG. 8A has been made in the L direction (e.g. a length-wise direction) of the transistor. However the effect of the present inventive concepts may be obtained even when the source follower gate 117 has been made in the W direction (e.g. a width-wise direction) of the transistor. In other words, FIG. 8A illustrates an example orientation of the source follower gate 117 on the transistor, but other orientations of the source follower gate 117 are possible without deviating from the present inventive concepts.

In some embodiments, since at least two first lower portions 117a may be provided, the source follower gate 117 may have an increased length facing the well impurity layer 120 within a limited pixel region. Accordingly, the source follower transistor DX of FIG. 2 may have an increased channel length between the third impurity region 125a and the fourth impurity region 125b.

Referring to FIGS. 8B and 8C, the source follower gate 117 may be formed by a deposition process. The deposition process may be performed to form stacked thin layers on the first recess region 122a such that the source follower gate 117 may be formed. When the deposition process is carried out, the source follower gate 117 may be formed to have a gap 117d resulting from a level difference between the first recess region 122a and the first surface 100a of the substrate 100. The gap 117d may be a recessed part that is recessed toward the first lower portion 117a from the first upper portion 117b.

In an embodiment, a contact area between the well impurity layer 120 and the source follower gate 117 including the gap 117*d* may be substantially the same as a contact area between the well impurity layer 120 and the source follower gate 117 without the gap 117*d*. Accordingly, regardless of occurrence of the gap 117*d*, it may be possible to reduce noise generated when the charges are stored or released at the source follower gate dielectric layer 117*c* caused by current fluctuation in a channel of the source follower transistor DX.

Figure 9:
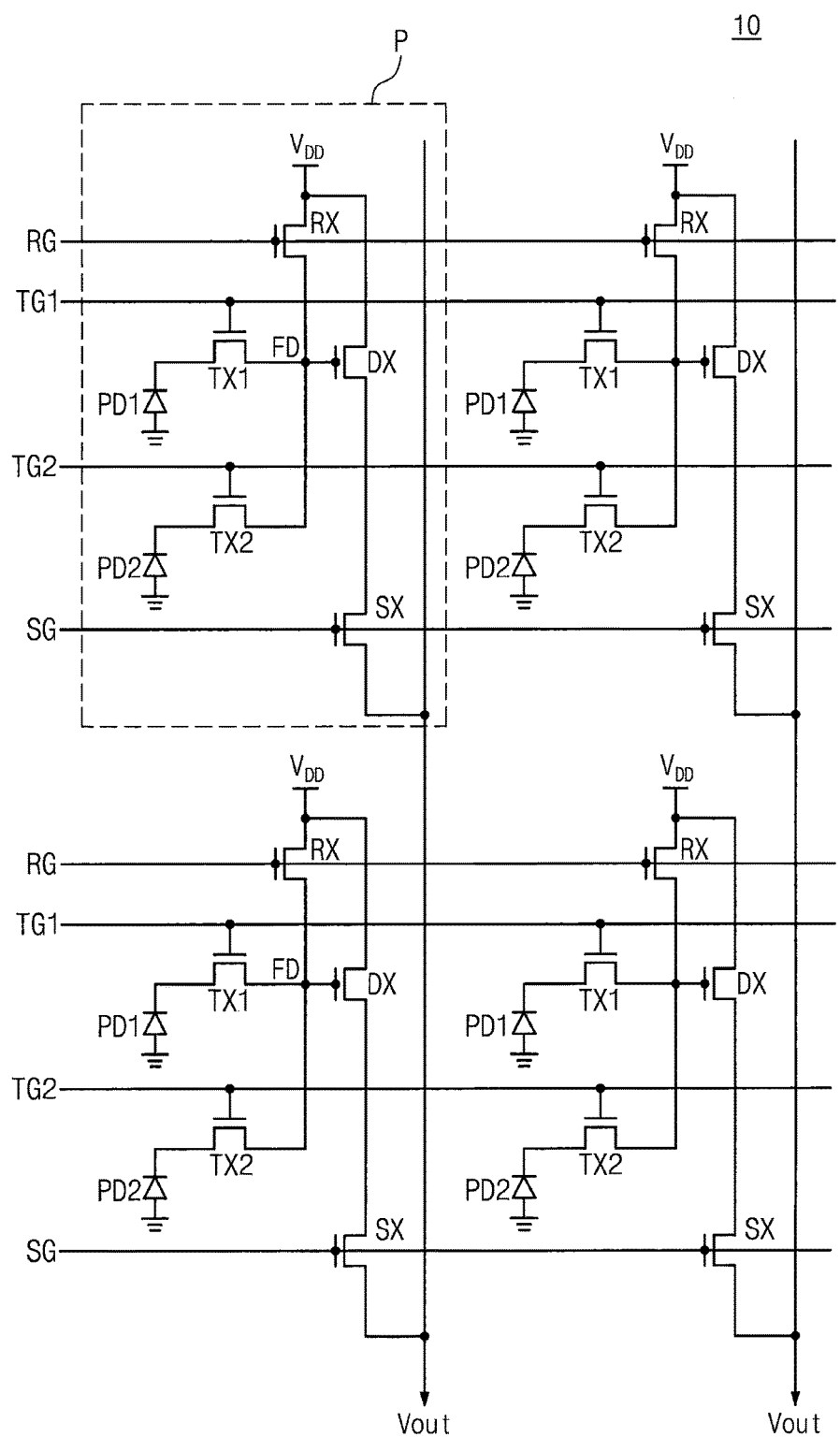
FIG. 9 is a circuit diagram illustrating an active pixel sensor array of a complementary metal oxide semiconductor image sensor according to example embodiments of the present inventive concepts.
Figure 10:
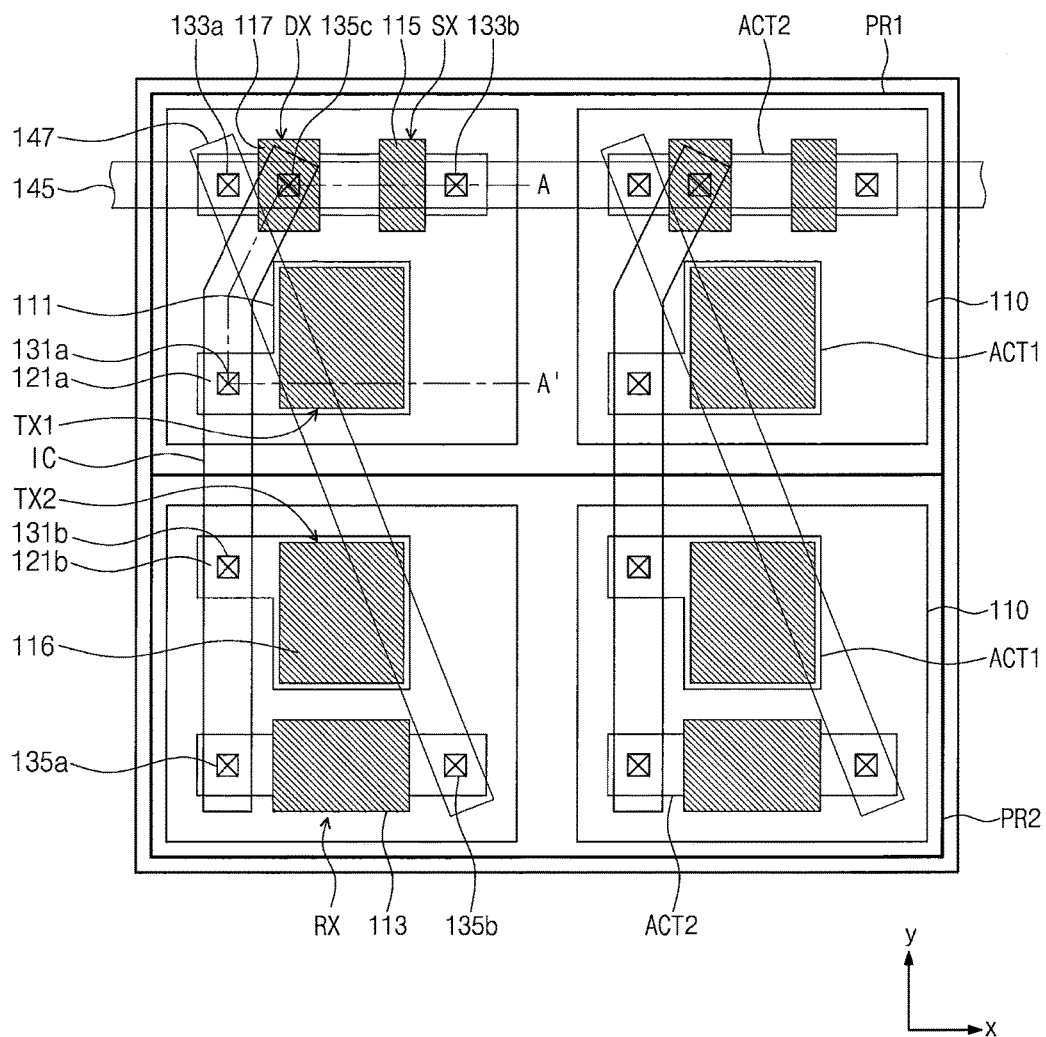
FIG. 10 is a plan view illustrating a complementary metal oxide semiconductor image sensor according to example embodiments of the present inventive concepts.
Figure 11:
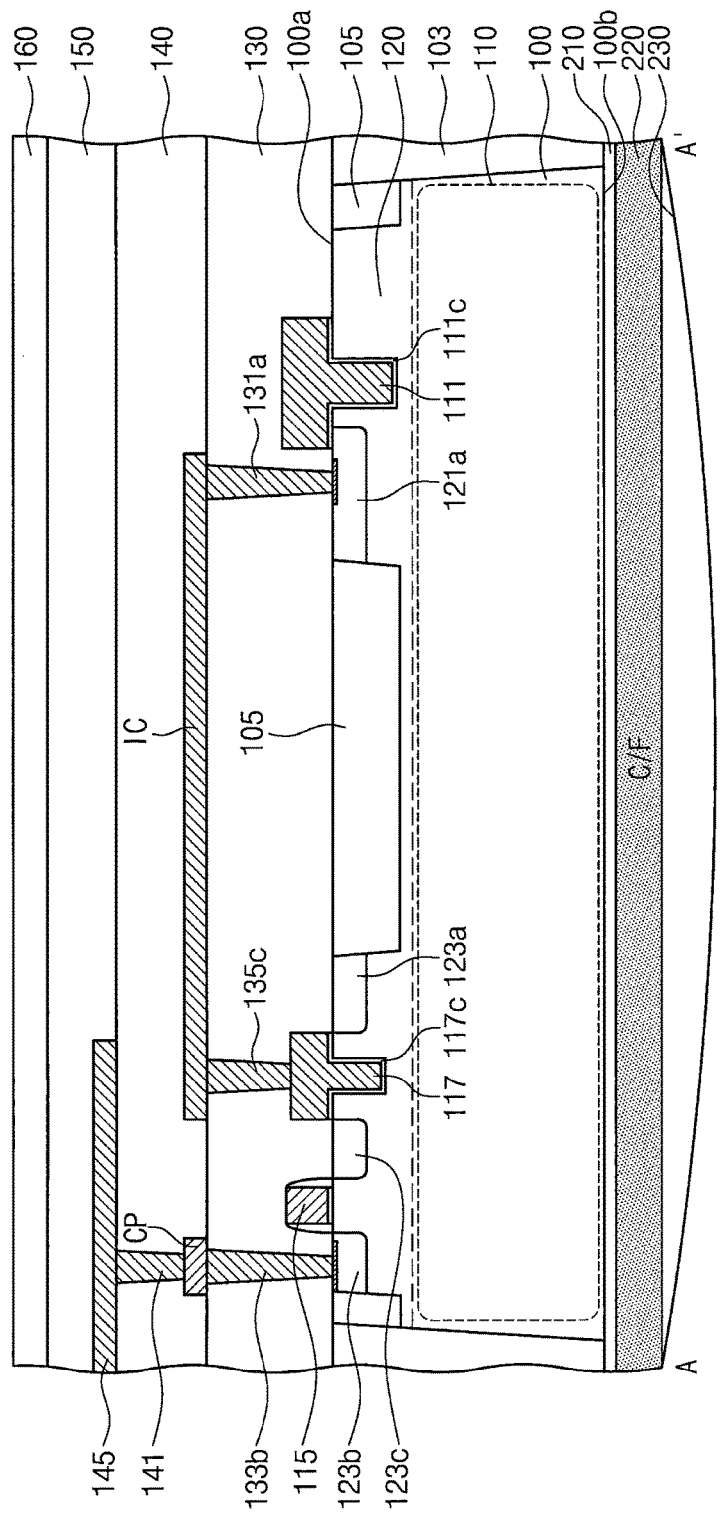
FIG. 11 is a cross-sectional view taken along line A-A' of FIG. 10.

FIG. 9 is a circuit diagram illustrating an active pixel sensor array 10 of a complementary metal oxide semiconductor image sensor according to example embodiments of the present inventive concepts. FIG. 10 is a plan view illustrating a complementary metal oxide semiconductor image sensor according to example embodiments of the present inventive concepts. FIG. 11 is a cross-sectional view taken along line A-A' of FIG. 10. Descriptions about the foregoing embodiments may be also applied to hereto, and thus repetitive descriptions will be omitted for conciseness.

Referring to FIG. 9, the complementary metal oxide semiconductor image sensor according to example embodiments of the present inventive concepts may differ from the complementary metal oxide semiconductor image sensor illustrated in FIG. 2 in the configuration of the selection transistor SX and the source follower transistor DX. In the complementary metal oxide semiconductor image sensor illustrated in FIG. 9, a source electrode of the selection transistor SX may be coupled to the output line Vout and a drain electrode of the selection transistor SX may be connected to source electrode of the source follower transistor DX. A drain electrode of the source follower transistor DX may be connected to the power supply voltage VDD.

Referring to FIGS. 9 to 11, the first transfer gate 111, the selection gate 115 and the source follower gate 117 may be disposed on the first pixel area PR1, and the second transfer gate 116 and the reset gate 113 may be disposed on the second pixel area PR2. The first and second transfer gates 111 and 116 and the first and second floating diffusion regions 121*a* and 121*b* may be disposed on the first active section ACT1, and the reset gate 113, the selection gate 115, and the source follower gate 117 may be disposed on the second active section ACT2.

The first impurity region 123*a* may be disposed on a side of the source follower gate 117 in the well impurity layer 120, and the second impurity region 123*b* may be disposed on a side of the selection gate 115 in the well impurity layer 120. The common impurity region 123*c* may be disposed in the well impurity layer 120 between the source follower gate 117 and the selection gate 115.

A plurality of contact plugs may be disposed in the first interlayer dielectric layer 130. The first impurity region 123*a* may be connected to the first contact plug 133*a*, and the second impurity region 123*b* may be connected to the second contact plug 133*b*. The source follower gate 117 may be connected to the gate contact plug 135*c*. The first and second floating diffusion regions 121*a* and 121*b* may be connected to the first and second FD contact plugs 131*a* and 131*b*, respectively.

An interconnection line IC may be provided to electrically connect the first and second floating diffusion regions 121*a* and 121*b*, the source follower gate 117, and the third impurity region 125*a* with one another. The interconnection line IC may extend substantially in the y-axis direction. The interconnection line IC may be disposed on the first interlayer dielectric layer 130 and electrically connected to the first and second floating diffusion regions 121*a* and 121*b* through the first and second FD contact plugs 131*a* and 131*b*. The interconnection line IC may be electrically connected to the source follower gate 117 through the gate contact plug 135*c*. The interconnection line IC may be electrically connected to the third impurity region 125*a* through the third contact plug 135*a*.

A conductive pattern CP may be disposed on the first interlayer dielectric layer 130 and connected to the second contact plug 133*b*. The conductive pattern CP may be electrically connected to the second impurity region 123*b* through the second contact plug 133*b*. In some embodiments, the interconnection line IC and the conductive pattern CP may be formed of an alloy including copper (Cu), aluminum (Al), tungsten (W), titanium (Ti), molybdenum (Mo), tantalum (Ta), titanium nitride (TiN), tantalum nitride (TaN), zirconium nitride (ZrN), tungsten nitride (TiN), or any combination thereof.

The second interlayer dielectric layer 140 may be disposed on the first interlayer dielectric layer 130 and cover the interconnection line IC and the conductive pattern CP.

The first line 145 may be disposed on the second interlayer dielectric layer 140. The second line 147 may be disposed on the third interlayer dielectric layer 150. The first and second lines 145 and 147 may extend across each other. The first line 145 may be electrically connected to the second impurity region 123*b* through the upper plug 141. The first line 145 may be connected to the second contact plug 133*b* and the conductive pattern CP. The second line 147 may be connected to the first contact plug 133*a* and the fourth contact plug 135*b*.

Figure 12:
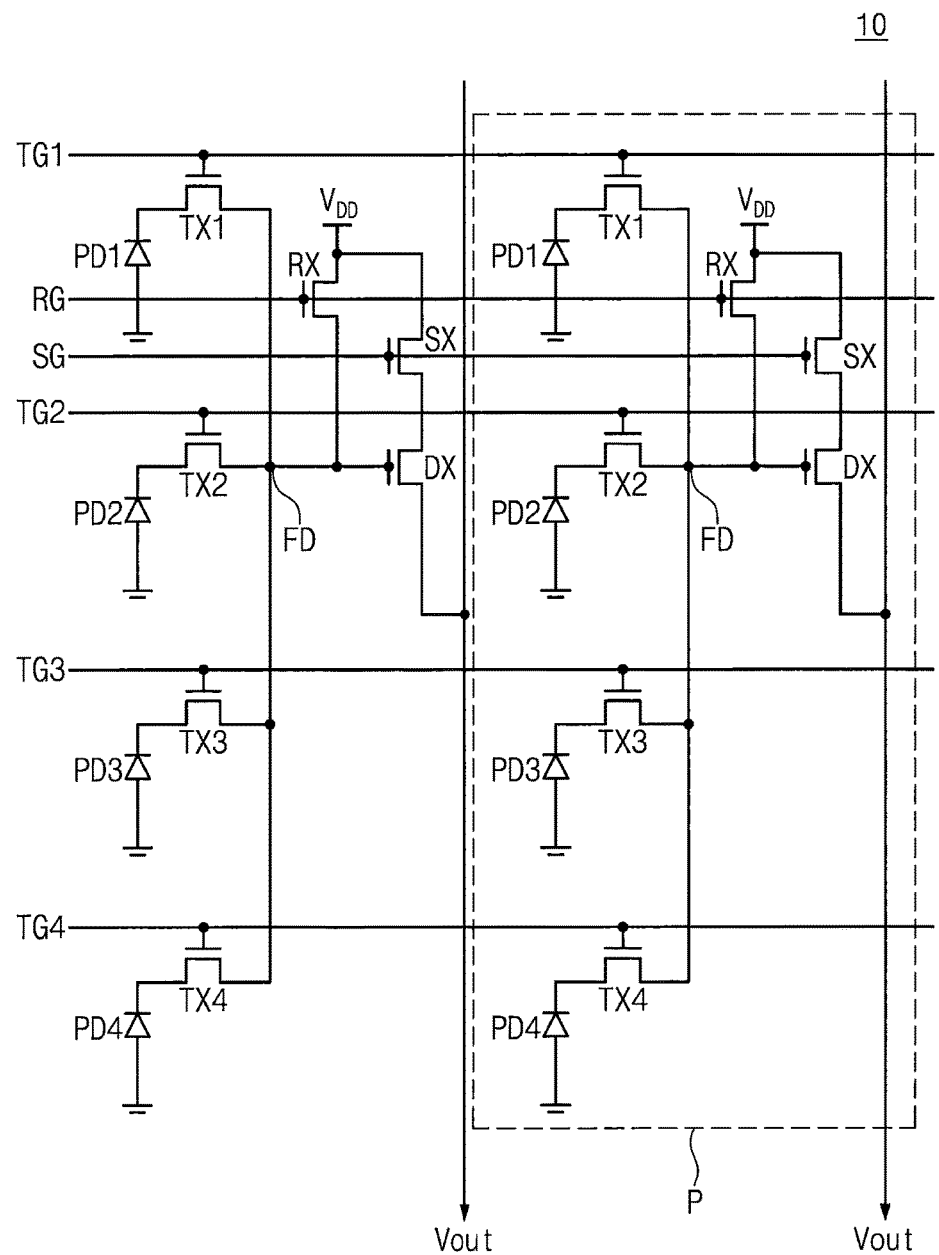
FIG. 12 is a circuit diagram illustrating an active pixel sensor array of a complementary metal oxide semiconductor image sensor according to example embodiments of the present inventive concepts.

FIG. 12 is a circuit diagram illustrating an active pixel sensor array 10 of a complementary metal oxide semiconductor image sensor according to example embodiments of the present inventive concepts.

Referring to FIG. 12, the active pixel sensor array 10 may include a plurality of the unit pixels P, and each of the unit pixels P may include four transfer transistors TX1, TX2, TX3 and TX4. The four transfer transistors TX1, TX2, TX3 and TX4 may share the charge detection node FD and the logic transistors RX, SX and DX.

According to example embodiments of the present inventive concepts, each row of the unit pixels P may be selected by a selection signal in a read operation. One of first to fourth photoelectric conversion devices PD1, PD2, PD3 and PD4 may transfer charges to the charge detection node FD in response to signals applied to first to fourth transfer gates TG1, TG2, TG3 and TG4.

In some embodiments, the transfer gates 111 and 116 may have planar shapes. In addition, the active pixel sensor array 10 may include a plurality of the unit pixels P, and each of the unit pixels P may include eight transfer transistors TX, and the eight transfer transistors TX may share the charge detection node FD and the logic transistors RX, SX and DX.

Figure 13:
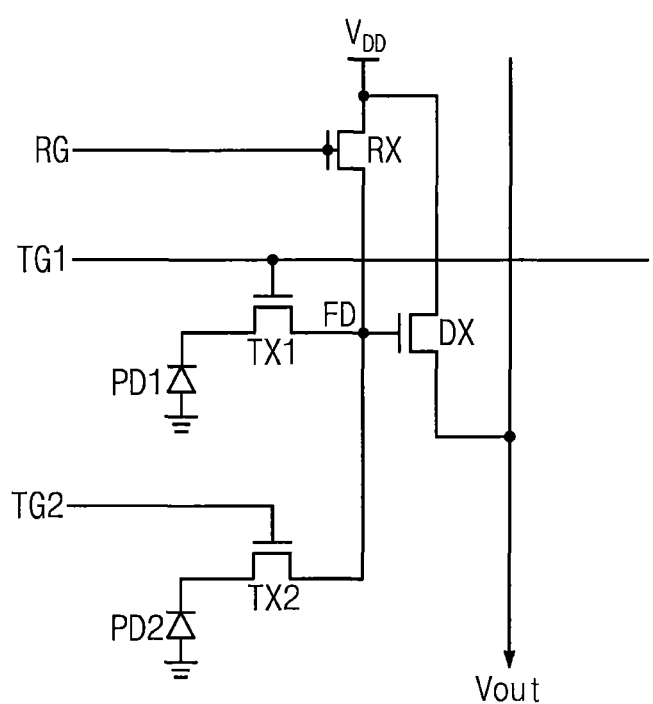
FIG. 13 is a circuit diagram illustrating an active pixel sensor array of a complementary metal oxide semiconductor image sensor according to example embodiments of the present inventive concepts.
Figure 14:
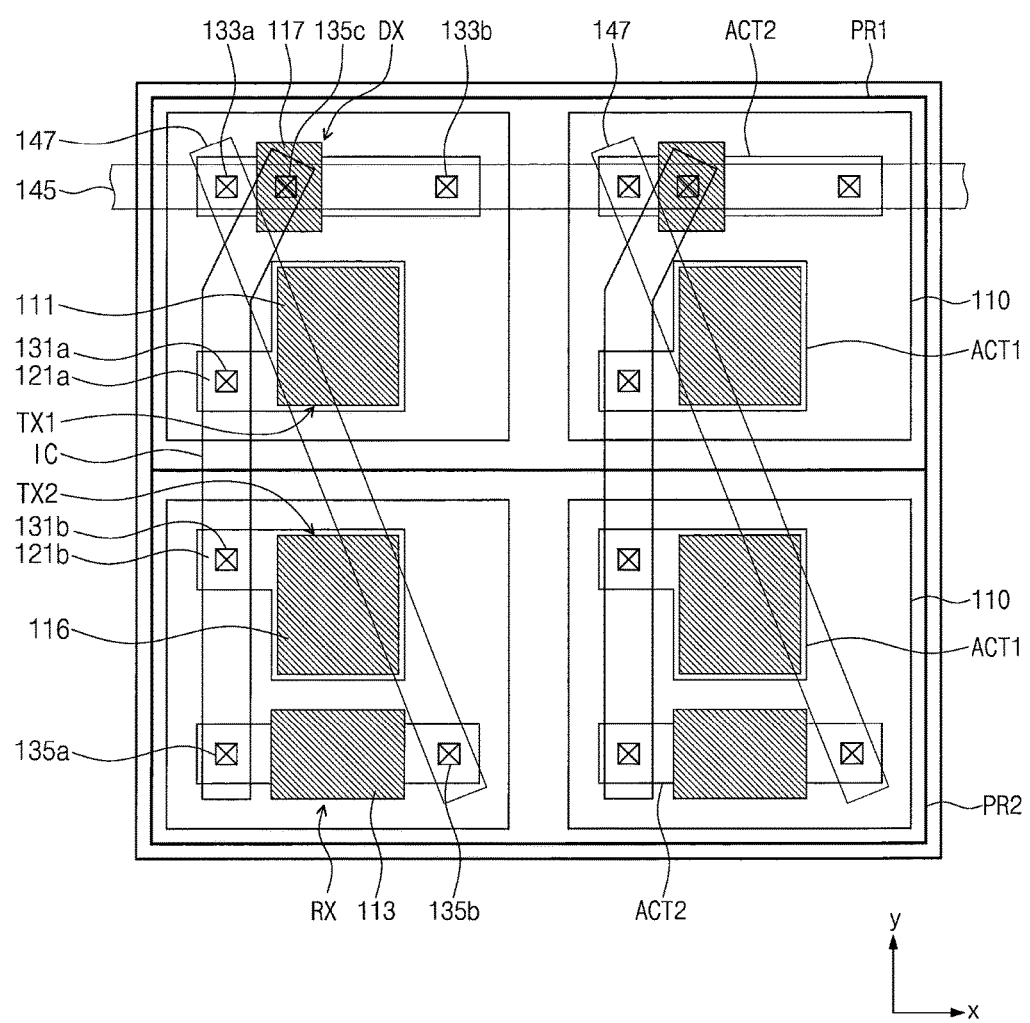
FIG. 14 is a plan view illustrating a complementary metal oxide semiconductor image sensor according to example embodiments of the present inventive concepts.

FIG. 13 is a circuit diagram illustrating an active pixel sensor array 10 of a complementary metal oxide semiconductor image sensor according to example embodiments of the present inventive concepts. FIG. 14 is a plan view illustrating a complementary metal oxide semiconductor image sensor according to example embodiments of the present inventive concepts. In the description that follows, a discussion of features identical to those of FIGS. 9 and 10 may be omitted to avoid repetition.

Referring to FIGS. 13 and 14, the active pixel sensor array 10 may include two transfer transistors TX1 and TX2. The two transfer transistors TX1 and TX2 may share the charge detection node FD and the logic transistors RX and DX.

The first and second photoelectric devices PD1 and PD2 may receive light incident to the first and second pixel regions PR1 and PR1, respectively, and generate charges based on the received light. The generated charges may be transferred to the charge detection node FD in response to signals applied to the first and second transfer gates TG1 and TG2.

When the reset transistor RX is turned on, the power supply voltage VDD connected to the source electrode of the reset transistor RX may be transmitted to the charge detection node FD. Accordingly, the charges accumulated in the charge detection node FD may be exhausted and thus the charge detection node FD may be reset when the reset transistor RX is turned on. In addition, when the first and second pixel region PR1 and PR2 are respectively not selected, the reset transistor RX may hold the charge detection node FD at a low level state (e.g., 0 volts) and thus the source follower transistor DX may be in a turned-off state. The operation of the reset transistor RX may be implemented by a reset switch (not shown) between the reset gate RG applied to a reset signal and the VDD voltage node.

The source follower transistor DX may output a voltage signal corresponding to a potential of the charge detection node FD to the output line Vout. The source follower transistor DX may output a reset signal in response to a potential when the charge detection node FD is reset or may output an image signal in response to a potential when the charges are accumulated in the charge detection node FD. In other words, the operation of the source follower transistor DX may be determined by adjusting voltage applied to the reset transistor RX.

In some embodiments, the CMOS images sensor is not limited to an ISOCELL structure in which the first device isolation layer 103 is provided to define the first and second pixel regions PR1 and PR2.

According to example embodiments of the present inventive concepts, the vertical structural source follower gate may be provided within a limited area but have an increased area. Accordingly, during the operation of the CMOS image sensor, it may be advantageous to reduce noise generated when the charges are stored or released at the gate dielectric layer caused by current fluctuation in a channel of the source follower transistor.

Furthermore, the device isolation layer may be provided to surround portions the photoelectric conversion layers respectively formed on the pixel regions and thus the photoelectric conversion layers may be separated from each other, thereby suppressing cross talk. Accordingly, it may be possible to enhance color reproduction characteristics of the CMOS image sensor.

As used herein, the singular terms "a," "an," and "the" are intended to include the plural forms as well, unless the context clearly indicates otherwise. It will be understood that when an element is referred to as being "connected" or "coupled" to another element, it may be directly connected or coupled to the other element or intervening elements may be present. As used herein, the term "and/or" includes any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Similarly, it will be understood that when an element such as a layer, region or substrate is referred to as being "on" another element, it can be directly on the other element or intervening elements may be present. In contrast, the term "directly" means that there are no intervening elements. Additionally, the embodiments in the detailed description will be described with sectional views as ideal example views of the inventive concepts. Accordingly, shapes of the example views may be modified according to manufacturing techniques and/or allowable errors. Therefore, the embodiments of the inventive concepts are not limited to the specific shape illustrated in the example views, but may include other shapes that may be created according to manufacturing processes.

While such terms as "first," "second," etc., may be used to describe various components, such components must not be limited to the above terms. The above terms are used only to distinguish one component from another. For example, a first component discussed below could be termed a second component, and similarly, a second component may be termed a first component without departing from the teachings of this disclosure.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which these inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Although the present invention has been described in connection with the embodiments of the present inventive concepts illustrated in the accompanying drawings, it is not limited thereto. It will be apparent to those skilled in the art that various substitution, modifications and changes may be thereto without departing from the scope and spirit of the invention.

What is claimed is:

1. A complementary metal oxide semiconductor (CMOS) image sensor comprising:
    a substrate comprising a first surface, a second surface facing the first surface, and a first recess region that is recessed from the first surface toward the second surface;
    a transfer gate on the substrate; and
    a source follower gate on the first recess region,
    wherein the source follower gate is within the first recess region and partially covers the first surface of the substrate,
    wherein the source follower gate is coupled to a floating diffusion region of the CMOS image sensor,
    wherein the transfer gate is spaced apart from the source follower gate, wherein a portion of the transfer gate is in a second recess region extending from the first surface toward the second surface of the substrate, wherein the source follower gate extends to a first depth from the first surface toward the second surface of the substrate, and wherein the transfer gate extends to a second depth from the first surface toward the second surface of the substrate, the second depth being greater than the first depth.

2. The CMOS image sensor of claim 1, wherein the source follower gate comprises:
   a lower portion in the first recess region; and
   an upper portion that is connected to the lower portion and that is on the first surface of the substrate.

3. The CMOS image sensor of claim 1, further comprising:
   a photoelectric conversion layer in the substrate, wherein the photoelectric conversion layer has a first conductivity type; and
   a well impurity layer on the photoelectric conversion layer, wherein the well impurity layer is adjacent the first surface of the substrate and has a second conductivity type.

4. The CMOS image sensor of claim 3, wherein the first recess region is provided in the well impurity layer that has the second conductivity type and is spaced apart from the photoelectric conversion layer that has the first conductivity type.

5. A complementary metal oxide semiconductor (CMOS) image sensor comprising:
   a first device isolation layer in a substrate and defining a first pixel region and a second pixel region;
   a second device isolation layer defining first and second active sections in each of the first and second pixel regions;
   a source follower gate on the second active section of the first pixel region;
   a first transfer gate on the first active section of the first pixel region; and
   a second transfer gate on the first active section of the second pixel region,
   wherein the source follower gate comprises:
      a first lower portion in a first recess region on the second active section of the first pixel region; and
      a first upper portion that is connected to the first lower portion and is on a top surface of the substrate.

6. The CMOS image sensor of claim 5,
   wherein the first transfer gate comprises:
      a second lower portion in a second recess region on the first active section of the first pixel region; and
      a second upper portion that is connected to the second lower portion and is on the top surface of the substrate, and
   wherein the second transfer gate comprises:
      a third lower portion in a third recess region on the first active section of the second pixel region; and
      a third upper portion that is connected to the third lower portion and is on the top surface of the substrate.

7. The CMOS image sensor of claim 6, wherein the first lower portion has a first depth, the second lower portion has a second depth, and the third lower portion has a third depth, wherein the first depth is less than the second depth and the third depth.

8. The CMOS image sensor of claim 5, wherein the first lower portion extends from the first upper portion toward the substrate, and wherein the first lower portion is one of a plurality of first lower portions connected to the first upper portion.

9. The CMOS image sensor of claim 5, wherein the first and second transfer gates are planar structures on the top surface of the substrate.

10. The CMOS image sensor of claim 5, wherein the first and second pixel regions are arranged such that the first active sections of the first and second pixel regions are adjacent each other.

11. The CMOS image sensor of claim 5, further comprising:
    a first floating diffusion region on a side of the first transfer gate in the substrate;
    a second floating diffusion region on a side of the second transfer gate in the substrate; and
    a reset gate on the second active section of the second pixel region,
    wherein the source follower gate, the first and second floating diffusion regions, and an impurity region of the reset gate are electrically connected to each other.

12. The CMOS image sensor of claim 5, further comprising a photoelectric conversion layer in the substrate of each of the first and second pixel regions, wherein the first device isolation layer surrounds the photoelectric conversion layer in a plan view.

13. A complementary metal oxide semiconductor (CMOS) image sensor comprising:
    a substrate comprising a first surface and a second surface that is opposite the first surface,
       wherein the first surface comprises a first portion and a second portion, and
       wherein the first portion of the first surface is a first distance from the second surface, and
       wherein the second portion of the first surface is a second distance that is smaller than the first distance from the second surface;
    a photoelectric conversion layer in the substrate, wherein the photoelectric conversion layer has a first conductivity type;
    a well impurity layer on the photoelectric conversion layer, wherein the well impurity layer has a second conductivity type, different from the first conductivity type; and
    a source follower gate on the substrate,
    wherein the source follower gate has a first portion of the source follower gate on the first portion of the first surface and a second portion of the source follower gate on the second portion of the first surface, and
    wherein the second portion of the first surface that is closest to the second surface is in the well impurity layer and on the photoelectric conversion layer.

14. The CMOS image sensor of claim 13, further comprising:
    a first device isolation layer in the substrate and adjacent the photoelectric conversion layer; and
    a second device isolation layer in the well impurity layer and adjacent the first device isolation layer.

15. The CMOS image sensor of claim 13, wherein the first surface of the substrate further comprises a third portion that is a third distance, smaller than the first distance, from the second surface, and
    wherein the source follower gate further comprises a third portion of the source follower gate on the third portion of the first surface.

16. The CMOS image sensor of claim 13, wherein the source follower gate further comprises a gap in the second portion of the source follower gate that extends from an upper surface of the source follower gate towards the second portion of the first surface, and wherein a region of the second portion of the source follower gate is between the gap and the second portion of the first surface.

\* \* \* \* \*